United States Patent
Petrosyan et al.

(10) Patent No.: US 12,218,662 B1
(45) Date of Patent: Feb. 4, 2025

(54) LINE DRIVER WITH HIGH OVER-VOLTAGE PROTECTION

(71) Applicant: Synopsys, Inc., Sunnyvale, CA (US)

(72) Inventors: Tigran Petrosyan, Yerevan (AM); Arshavir Matevosyan, Glendale, CA (US); Davit Vanetsyan, Yerevan (AM); Davit Petrosyan, Oakville (CA); Ashot Muradyan, Yerevan (AM)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/969,161

(22) Filed: Oct. 19, 2022

Related U.S. Application Data

(60) Provisional application No. 63/257,485, filed on Oct. 19, 2021.

(51) Int. Cl.
*H03K 17/687* (2006.01)

(52) U.S. Cl.
CPC .............................. *H03K 17/6874* (2013.01)

(58) Field of Classification Search
CPC ........... H03K 17/6872; H03K 17/6874; H03K 19/00315; H03K 19/01852
See application file for complete search history.

(56) References Cited

U.S. PATENT DOCUMENTS

| | | | |
|---|---|---|---|
| 7,053,677 B2* | 5/2006 | Yu | H03K 19/00315 |
| | | | 327/333 |
| 10,817,639 B1* | 10/2020 | Tskitishvili | G06F 30/392 |
| 10,855,280 B2* | 12/2020 | Chern | H03K 17/687 |

* cited by examiner

*Primary Examiner* — Ryan Johnson
*Assistant Examiner* — Colleen J O Toole
(74) *Attorney, Agent, or Firm* — Weaver Austin Villeneuve & Sampson LLP

(57) ABSTRACT

A line driver circuit include a multitude of PMOS and NMOS transistors. A first PMOS transistor receives an output voltage of a first level converter. A second PMOS transistor receives a first reference voltage. A third and fourth PMOS transistors receive an output voltage of a second voltage level converter. The source terminal of the first PMOS transistor receives the supply voltage. The drain terminal of the fourth PMOS transistor is coupled to an output terminal of the line driver circuit. A first NMOS transistor receives an input signal. A second NMOS transistor receives a second reference voltage. A third and fourth NMOS transistors receive an output voltage of a third level converter. The first NMOS transistor receives a ground potential. The drain terminal of the fourth NMOS transistor is coupled to the output terminal of the line driver. The first, second and third voltage converters receive the input signal.

9 Claims, 3 Drawing Sheets

LINE DRIVER WITH HIGH OVER-VOLTAGE PROTECTION

RELATED APPLICATION

The present application claims benefit under 35 USC 119 (e) of U.S. Patent Application No. 63/257,485, filed Oct. 19, 2021, the content of which is incorporated herein by reference in its entirety.

TECHNICAL FIELD

The present disclosure relates to integrated circuits and, more particularly, to a line driver circuit that provides protection against high voltages.

BACKGROUND

A line driver is an electronic buffer circuit designed to amplify a signal that drives a load, such as a transmission line. A line driver therefore isolates the input stage of a circuit from the output stage, thereby reducing the load seen by the input stage and thus enabling the signals to be sent on, for example, a printed circuit board (PCB) or electrical wires over relatively long distances.

SUMMARY

A line driver circuit, in accordance with one embodiment of the present disclosure, includes, in part, a multitude of PMOS transistors, and a multitude of NMOS transistors. A first PMOS transistor receives an output voltage of a first voltage level converter. A second PMOS transistor receives a first reference voltage. A third PMOS transistor and a fourth PMOS transistor receive an output voltage of a second voltage level converter. The source terminal of the first PMOS transistor receives the supply voltage. The drain terminal of the fourth PMOS transistor is coupled to an output terminal of the line driver circuit. A first NMOS transistor receives an input signal. A second NMOS transistor receives a second reference voltage. A third NMOS transistor and a fourth NMOS transistor receive an output voltage of a third level converter. The first NMOS transistor receives a ground potential. The drain terminal of the fourth NMOS transistor is coupled to the output terminal of the line driver circuit. The first, second and third voltage converters receive the input signal.

In one embodiment, when the input signal is at a logic low level, the output voltage of the first voltage level converter is at a voltage defined by a difference between the supply voltage and a first intermediate voltage that is smaller than a breakdown voltage of the PMOS and NMOS transistors. When the input signal is at a logic high level, the output voltage of the first voltage level converter is at the supply voltage.

In one embodiment, when the input signal is at a logic low level, the output voltage of the second voltage level converter is at a voltage defined by a difference between the supply voltage and the first intermediate voltage. When the input signal is at a logic high level, the output voltage of the second voltage level converter is at a voltage defined by a difference between the supply voltage and a second intermediate voltage. The second intermediate voltage is smaller than twice the first intermediate voltage by an offset voltage.

In one embodiment, when the input signal is at a logic low level, the output voltage of the third voltage level converter is at the second intermediate voltage. When the input signal is at a logic high level, the output voltage of the third voltage level converter is at the first intermediate voltage.

In one embodiment, the first reference voltage is defined by the difference between the supply voltage and the first intermediate voltage. In one embodiment, the second fixed reference voltage is defined by the first intermediate voltage. In one embodiment, the line driver circuit further includes, in part, a first diode-connected PMOS transistor coupled between the output terminal and the fourth PMOS transistor. In one embodiment, the line driver circuit further includes, in part, a second diode-connected NMOS transistor coupled to the output terminal, and a third diode-connected NMOS transistor coupled between the second diode-connected NMOS transistor and the fourth NMOS transistor. In one embodiment, the supply voltage has a value ranging from 3 volts to 3.63 volts.

A system, in accordance with one embodiment of the present disclosure, includes, in part, a memory storing instructions, and a processor, coupled with the memory and configured to execute the instructions. The instructions when executed cause the processor to generate data representative of a multitude of PMOS and NMOS transistors. A first PMOS transistor receives an output voltage of a first voltage level converter. A second PMOS transistor receives a first reference voltage. A third PMOS transistor and a fourth PMOS transistor receive an output voltage of a second voltage level converter. A source terminal of the first PMOS transistor receives a supply voltage. A drain terminal of the fourth PMOS transistor is coupled to an output terminal of the line driver circuit. A first NMOS transistor receives an input signal. A second NMOS transistor receives a second reference voltage. A third NMOS transistor and a fourth NMOS transistor receive an output voltage of a third level converter. The first NMOS transistor receives a ground potential. The drain terminal of the fourth NMOS transistor is coupled to the output terminal of the line driver circuit. The first, second and third voltage converters receive the input signal.

In one embodiment, when the input signal is at a logic low level, the output voltage of the first voltage level converter is at a voltage defined by a difference between the supply voltage and a first intermediate voltage that is smaller than a breakdown voltage of the PMOS and NMOS transistors. When the input signal is at a logic high level, the output voltage of the first voltage level converter is at the supply voltage.

In one embodiment, when the input signal is at a logic low level, the output voltage of the second voltage level converter is at a voltage defined by a difference between the supply voltage and the first intermediate voltage. When the input signal is at a logic high level, the output voltage of the second voltage level converter is at a voltage defined by a difference between the supply voltage and a second intermediate voltage that is smaller than twice the first intermediate voltage by an offset voltage.

In one embodiment, when the input signal is at a logic low level, the output voltage of the third voltage level converter is at the second intermediate voltage. When the input signal is at a logic high level, the output voltage of the third voltage level converter is at the first intermediate voltage.

In one embodiment, the first reference voltage is defined by the difference between the supply voltage and the first intermediate voltage. In one embodiment, the second reference voltage is defined by the first intermediate voltage. In one embodiment, the instructions further cause the processor to: generate data representative of a first diode-connected PMOS transistor coupled between the output terminal and the fourth PMOS transistor, generate data representative of a second diode-connected NMOS transistor coupled to the output terminal; and generate data representative of a third diode-connected NMOS transistor coupled between the second diode-connected NMOS transistor and the fourth NMOS transistor.

A non-transitory computer readable medium comprises stored instructions, which when executed by a processor, cause the processor to generate data representative of a line drive circuit, the line driver circuit includes, in part, a multitude of PMOS transistors, and a multitude of NMOS transistors. A first PMOS transistor receives an output voltage of a first voltage level converter. A second PMOS transistor receives a first reference voltage. A third PMOS transistor and a fourth PMOS transistor receive an output voltage of a second voltage level converter. The source terminal of the first PMOS transistor receives the supply voltage. The drain terminal of the fourth PMOS transistor is coupled to an output terminal of the line driver circuit. A first NMOS transistor receives an input signal. A second NMOS transistor receives a second reference voltage. A third NMOS transistor and a fourth NMOS transistor receive an output voltage of a third level converter. The first NMOS transistor receives a ground potential. The drain terminal of the fourth NMOS transistor is coupled to the output terminal of the line driver circuit. The first, second and third voltage converters receive the input signal.

In one embodiment, when the input signal is at a logic low level, the output voltage of the first voltage level converter is at a voltage defined by a difference between the supply voltage and a first intermediate voltage that is smaller than a breakdown voltage of the PMOS and NMOS transistors. When the input signal is at a logic high level, the output voltage of the first voltage level converter is at the supply voltage.

In one embodiment, when the input signal is at a logic low level, the output voltage of the second voltage level converter is at a voltage defined by a difference between the supply voltage and the first intermediate voltage. When the input signal is at a logic high level, the output voltage of the second voltage level converter is at a voltage defined by a difference between the supply voltage and a second intermediate voltage. The second intermediate voltage is smaller than twice the first intermediate voltage by an offset voltage.

In one embodiment, when the input signal is at a logic low level, the output voltage of the third voltage level converter is at the second intermediate voltage. When the input signal is at a logic high level, the output voltage of the third voltage level converter is at the first intermediate voltage.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to line drivers with high over-voltage protection. A line driver circuit fabricated using a CMOS technology should be able to operate at supply voltages that are typically substantially higher than the junction breakdown voltages of the P-channel MOS (PMOS) and N-channel MOS (NMOS) transistors disposed in the line driver circuit. For example, for USB 2.0, the line voltage is defined as 3.3±10% volts (V). This results in a supply voltage that may reach nearly 3.63V under some conditions. Such a supply voltage is substantially higher than the typical breakdown voltage (e.g., 1.5V) of PMOS and NMOS transistors fabricated using a 5 nm CMOS process.

A typical line driver circuit includes a number of PMOS and NMOS transistors adapted to drive an output load. However, as the breakdown voltages of such transistors continue to scale down at a faster rate than the corresponding supply voltages, the transistors disposed in a typical line driver may be exposed to excessively high junction voltages that cause the transistors to degrade and become inoperable over time.

Embodiments of the present disclosure overcome the aforementioned challenges by forming, in part, a line driver having disposed therein a multitude of PMOS and NMOS transistors. A number of the PMOS and NMOS transistors receive level-converted voltages as well as reference voltages. Among technical advantages of the present disclosure are a line driver circuit having PMOS and NMOS transistors that are not subject to junction voltages exceeding their respective breakdown voltages, and that may be readily adapted to operate at different supply voltages.

Figure 1:
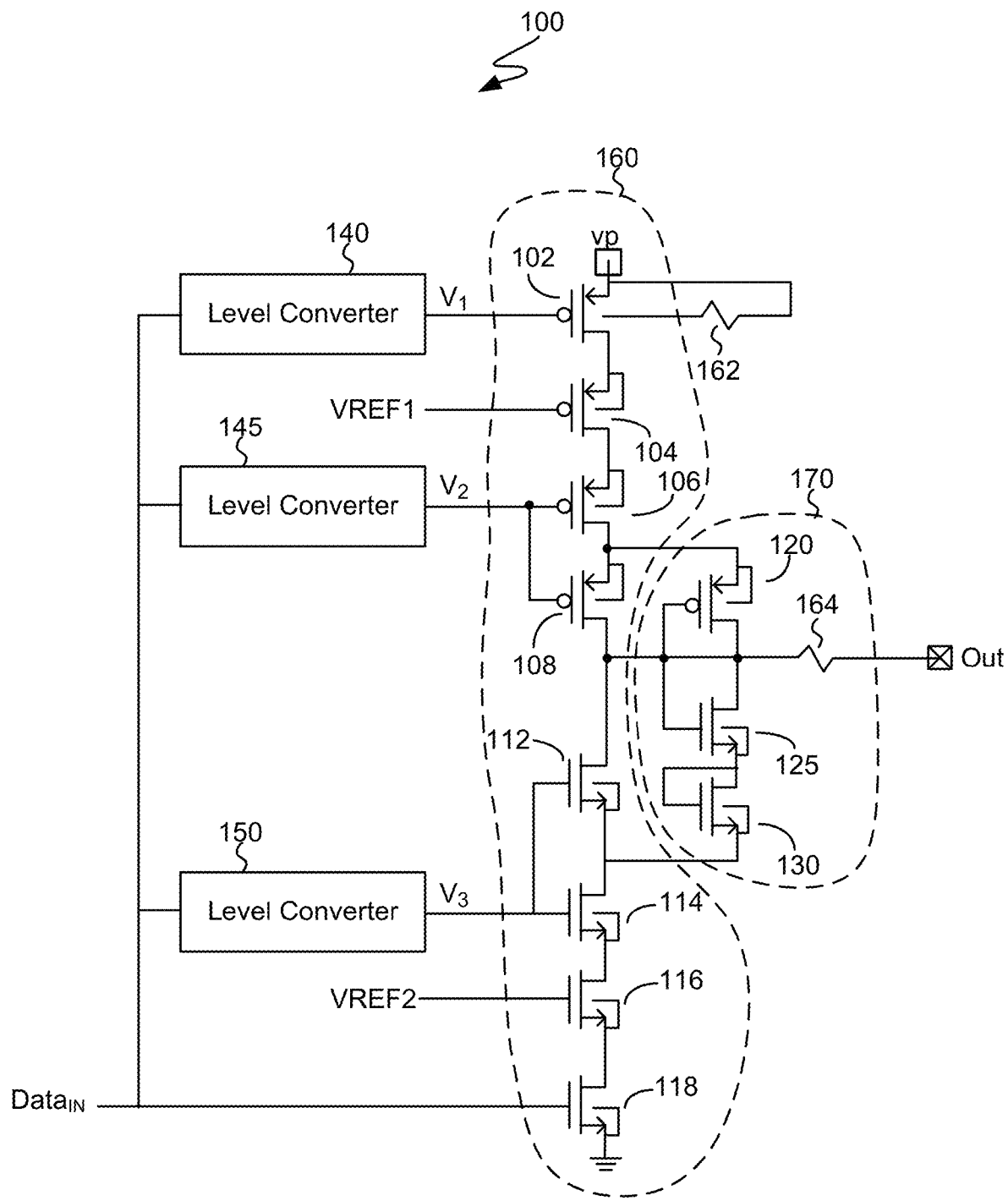
FIG. 1 is a transistor schematic diagram of a line driver circuit, in accordance with one embodiment of the present disclosure.

FIG. 1 is a transistor schematic diagram of a line driver circuit 100, in accordance with one embodiment of the present disclosure. Line driver 100 is shown as including, in part, a first stage 160 and a second stage 170. Line driver 100 is also shown as including, in part, a first voltage level converter 140, a second voltage level converter 145, and a third voltage level converter 150. First stage 160 is shown as including a cascade of PMOS transistors 102, 104, 106, 108, and a cascade of NMOS transistors 112, 114, 116, 118. Second stage 170 is shown as including a diode-connected PMOS transistor 170, and a pair of diode-connected NMOS transistors 125, 130.

PMOS transistor 102 has a source terminal receiving the supply voltage Vp, and a gate terminal receiving the output voltage V1 of voltage level converter 140. PMOS transistor 104 has a source terminal coupled to the drain terminal of PMOS transistor 102, and a gate terminal receiving a first reference voltage VREF1. PMOS transistor 106 has a source terminal coupled to the drain terminal of PMOS transistor 104 and a gate terminal receiving the output voltage V2 of level converter 145. PMOS transistor 108 has a source terminal coupled to the drain terminal of PMOS transistor 106, a gate terminal receiving the output voltage V2 of level converter 145, and a drain terminal coupled to output terminal OUT that is terminated with a resistor 164 that typically has a resistance of 50 Ohms.

NMOS transistor 112 has a drain terminal coupled to the output terminal OUT, and a gate terminal receiving the output voltage V3 of voltage level converter 150. NMOS transistor 114 has a drain terminal coupled to the source terminal of transistor 112, and a gate terminal receiving the output voltage V3 of voltage level converter 150. NMOS transistor 116 has a drain terminal coupled to the source terminal of transistor 114 and a gate terminal receiving a second reference voltage VREF2. NMOS transistor 118 has a drain terminal coupled to the source terminal of transistor 116, a gate terminal receiving the data input signal Data$_{IN}$, and a source terminal coupled to the ground voltage. Data input signal Data$_{IN}$ is also applied to the input terminals of voltage level converters (alternatively referred to herein as level converters) 140, 145 and 150.

PMOS transistor 120 of second stage 170 has a source terminal coupled to the source terminal of transistor 108, and gate and drain terminals coupled to the output terminal OUT. NMOS transistor 125 of second stage 170 has gate and drain terminals that are coupled to the output terminal OUT, and a source terminal coupled to the drain and gate terminals of NMOS transistor 130. The source terminal of NMOS transistor 130 is coupled to the source terminal of transistor 112.

As is described herein, line driver circuit 100 is adapted to receive input data DATA$_{IN}$ and generate, in response, an output voltage at the output terminal OUT that varies between the ground voltage and supply voltage Vp. Line driver circuit 100 maintains the gate-to-source and gate-to-drain voltages of the transistors disposed therein below their respective junction breakdown voltages. The junction breakdown voltage of the NMOS and PMOS transistors disposed in line driver circuit 100 is alternatively referred to as BV. Supply voltage Vp of line driver circuit 100 typically has a value that may range from 3.3 volts to 3.63 volts.

When the input data DATA$_{IN}$ is at a logic low level (i.e., 0 volts), voltage converter 140 generates a voltage V1 having a value defined by (Vp-BVX). Voltage BVX is an intermediate voltage that is smaller than voltage BV by an offset to ensure that the transistors in the line driver circuit do not enter the breakdown region. For example, in one embodiment, if BV is 1.5 volts, BVX may be set to 1.2 volts. Because V1 is at (Vp-BVX), PMOS transistor 102 is in a conductive (on) state, thereby causing the drain of PMOS transistor 104 to receive supply voltage Vp. Reference voltage VREF1 also has a value defined by (Vp-BVX). Accordingly, when input data DATA$_{IN}$ is at a logic low level, PMOS transistor 104 is also on, thus causing the drain of PMOS transistor 104 to be pulled up to the supply voltage Vp. Therefore, the gate-to-source and the gate-to-drain voltages of PMOS transistors 102 and 104 do not exceed their respective junction breakdown voltages.

When the input data DATA$_{IN}$ is at a logic low level, voltage converter 145 generates a voltage V2 having a value defined by (VP-BVX). Therefore, because the source of transistor 106 is at Vp volts, and the gate of transistor 106 is at (Vp-BVX) volts, the gate-to-source and gate-to-drain voltages of PMOS transistor 106 do not exceed their respective junction breakdown voltages. Furthermore, because the gate terminals of transistors 106 and 108 are coupled to one another, and further, because the source of transistor 108 receives the supply voltage Vp, the gate-to-source and gate-to-drain voltages of PMOS transistor 106 do not exceed their respective junction breakdown voltages. Consequently, when the input data DATA$_{IN}$ applied to line driver 100 is at a logic low level, the gate-to-source and gate-to-drain voltages of PMOS transistors 102, 1046, 106, and 108 are below their respective junction breakdown voltages. Moreover, as described above, when the input data DATA$_{IN}$ is at a logic low level, the output voltage OUT receives voltage Vp. In one example, when Vp is set to 3.63 volts and BV is at 1.2 volts, the gate voltages of transistors M1, M2, M3 and M4 receive 2.43 volts, and the source of transistors M1, M2, M3 and M4 receive 3.63 volts.

When the input data DATA$_{IN}$ is at a logic low level, voltage converter 150 generates a voltage V3 having an intermediate value defined by nearly (2BVX-Voffset). Voltage Voffset is selected to provide a margin of safety to prevent the transistors from entering into a breakdown region. For example, in one embodiment, when VP and BVX are at 3.63 and 1.2 volts respectively, Voffset may be selected to have a value to 0.3 volts, thereby causing V2 to be set to 2.1 volts.

Therefore, when the input data DATA$_{IN}$ is at a logic low level, the gate terminals of transistors 112 and 114 is at (2BVX-Voffset) volts. Because (2BVX-Voffset) is smaller than VP, both transistors 112 and 114 are off. To ensure that the gate-to-source voltage of transistor 112 does not exceed the breakdown voltage, diode-connected transistors 125 and 130 pull the source of transistor 112 to two transistor threshold voltages below the VP voltage, namely to (Vp-2VT), where VT is the threshold voltage of the transistors; this ensures that transistor 112, while remaining off, does not enter the breakdown region. For example, in one embodiment, if voltages VP, and Vt are 3.63 volts and 0.5 volts respectively, the source of transistor 114 is at 2.63 volts.

Because, the drain of transistor 114 receives the voltage (Vp-2VT), and its gate receives voltage (2BVX-Voffset), the voltage at source of transistor 116 is one threshold voltage below its gate voltage. For example, if voltages VP, (2BVX-Voffset), and Vt are at 3.63 volts, 2.1 volts, and 0.5 volts respectively, and the source of transistor 114 is at 2.63 volts, then the source of transistor 114 is nearly at 1.63 volts.

The reference voltage VREF2 applied to the gate of transistor 116 is at BVX volts, therefore the voltage at source of transistor 116 is one threshold voltage below its gate voltage. For the example described above, and assuming VREF2 is 1.2 volts, then the source of transistor 116 is at 0.7 volts. Transistor 118 is off when input data DATA$_{IN}$ is at a logic low-level. However, because the drain terminal of transistor 18 is coupled to the source of transistor 116 and the source terminal of transistor 18 receives the ground potential, transistor 118 is also inhibited from entering a breakdown region. For the example provided above, the drain terminal of transistor 118 is at 0.7 volts. Therefore, in accordance with embodiments of the present disclosure, all PMOS and NMOS transistors in line driver circuit 100 operate safely in the normal active region of operation and without entering the breakdown region.

When the input data DATA$_{IN}$ applied to line driver circuit 100 is at a logic high level (i.e., 1.2 volts), NMOS transistor 118 is on, thereby causing the drain of NMOS transistor 118 to be pulled to the ground voltage. Because voltage VREF2 is larger than VT, transistor 116 is also on, thus pulling the drain voltage of transistor 116 to the ground voltage. When the input data DATA$_{IN}$ is at a logic high level, voltage V3 generated by level converter 150 is defined by BVX. Accordingly, both transistors 114 and 112 are also on, thereby pulling the output voltage OUT to the ground potential. Accordingly, all NMOS transistors 118, 116, 114 and 112 of line driver 100 operate safely in the normal active region of operation and without entering the breakdown region. Resistor 162 is a current limiting resistor that ensure the gate-to-source diode of transistor 102 is not forward biased.

When the input data DATA$_{IN}$ is at a logic high level, voltage V1 generated by voltage converter 140 is at supply voltage Vp. Therefore, because both the gate and source terminals of PMOS transistor 102 are at voltage Vp, PMOS transistor 102 is off. However, the charges (equivalent to the full Vp voltage) that were present at the drain node of PMOS transistor 102 when $DATA_{IN}$ was previously at a logic low level, get redistributed between the remaining cascade of PMOS transistors due to voltages (Vp-BVX) and (VP-2BVX+Voffset) applied respectively to the gate terminals of transistors 104, 106, and 108. For example, the source of PMOS transistor 104 remains one threshold voltage above voltage (Vp-BVX), and the source of PMOS transistor 106 remains one threshold voltage above voltage (VP-2BVX+Voffset). Diode-connected PMOS transistor 120 raises the voltage at the source of PMOS transistor 108 by threshold voltage above the output pad voltage, which is 0 when $DATA_{IN}$ is at a logic high level.

In one example, when Vp is 3.63 volts, BVX is 1.2 volts, and Voffset is 0.3 volts, as was also described above, reference voltage VREF1 is at 2.43 volts and voltage V2 generated by the level converter 145 is at 1.53 volts. This causes the sources of transistor 104 to be at 2.73 volt, and the source of transistor 108 to be at 1.83 volts. The source of transistor 108 is maintained above the ground potential by the threshold voltage of diode-connected transistor 120. Accordingly, because the gate-to-source and gate-to-drain voltages of each of PMOS transistors 102, 104, 106 and 108 is less than BV, PMOS transistors 102, 104, 106 and 108 are inhibited from entering the breakdown region.

Figure 2:
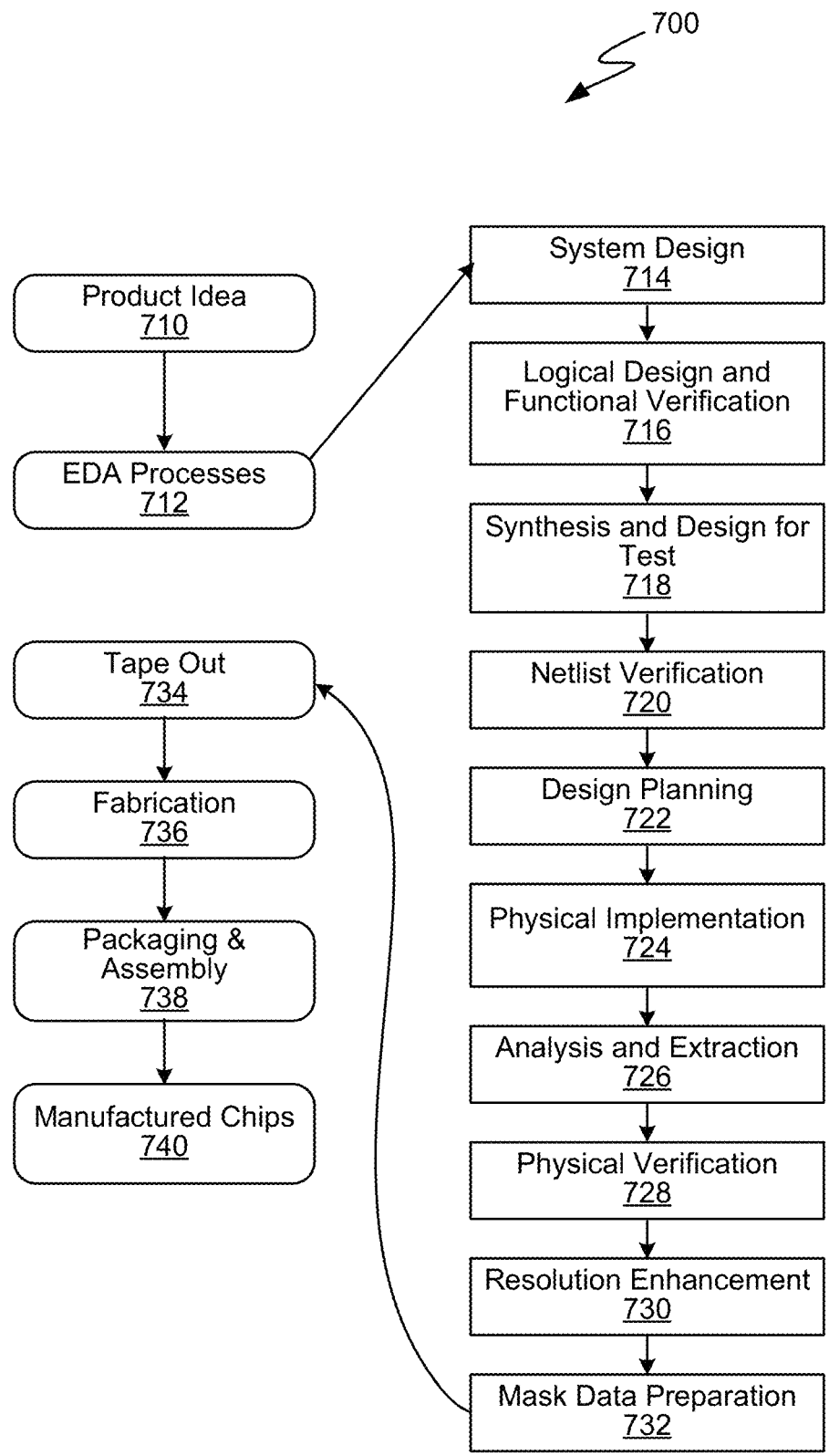
FIG. 2 depicts a flowchart of various processes used during the design and manufacture of an integrated circuit in accordance with some embodiments of the present disclosure.

FIG. 2 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, System Verilog, SystemC, MyHDL or Open Vera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 2. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 6) may be used to store the programs and data structures that are used by some or all of the EDA products described herein, and products used for development of cells for the library and for physical and logical design that use the library.

Figure 3:
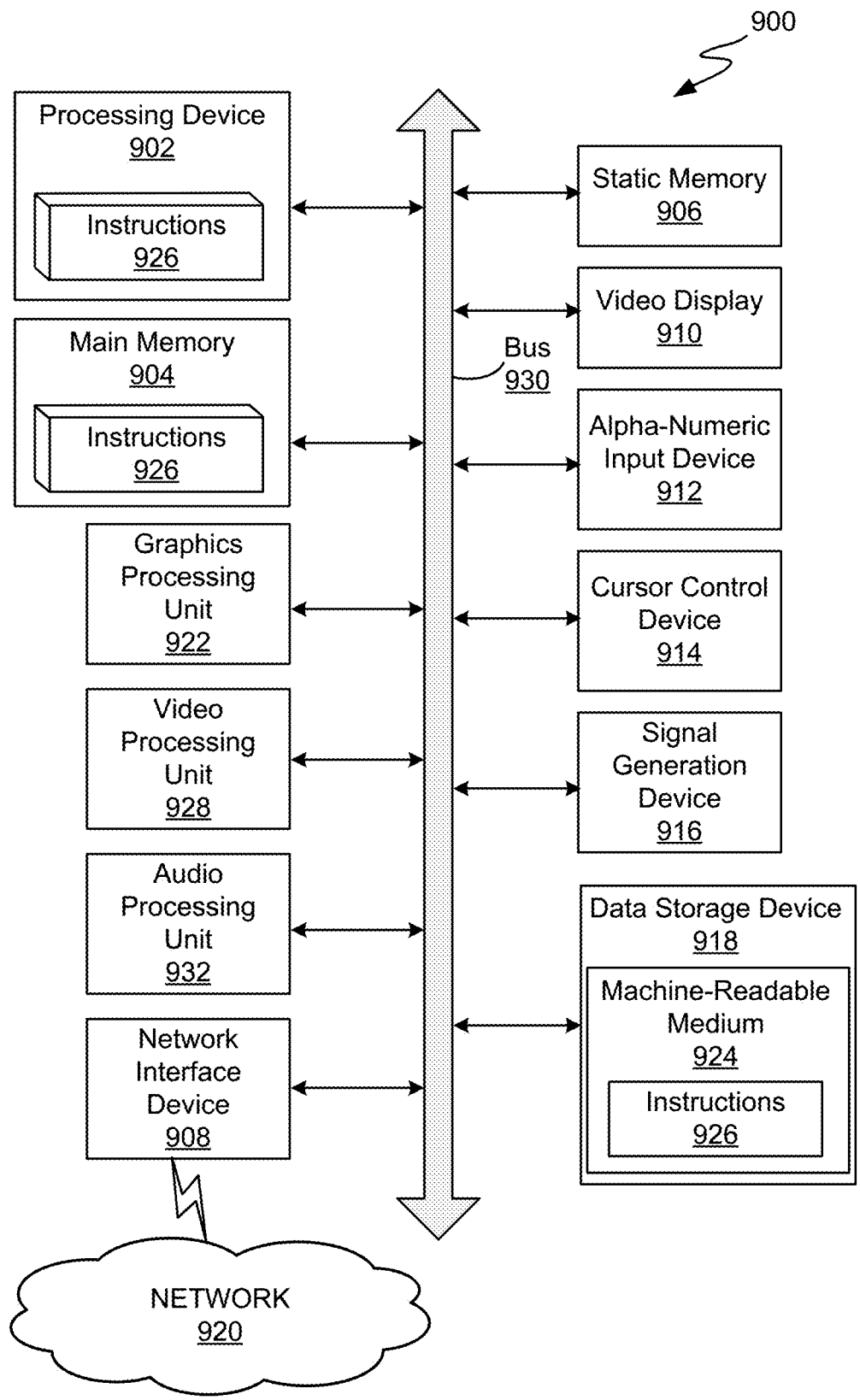
FIG. 3 depicts an example diagram of an example computer system in which embodiments of the present disclosure may operate.

FIG. 3 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A line driver circuit, comprising:
a plurality of cascaded PMOS transistors, wherein a first PMOS transistor receives an output voltage of a first voltage level converter, a second PMOS transistor receives a first reference voltage, a third PMOS transistor and a fourth PMOS transistor, wherein a gate terminal of the third PMOS transistor and a gate terminal of the fourth PMOS transistor are connected to a first node receiving an output voltage of a second voltage level converter, wherein a source terminal of the first PMOS transistor receives a supply voltage, and wherein a drain terminal of the fourth PMOS transistor is coupled to an output terminal of the line driver circuit; and
a plurality of cascaded NMOS transistors, wherein a first NMOS transistor receives an input signal, a second NMOS transistor receives a second reference voltage, a third NMOS transistor and a fourth NMOS transistor, wherein a gate terminal of the third NMOS transistor and a gate terminal of the fourth NMOS transistor are connected to a second node receiving an output voltage of a third voltage level converter, wherein the first NMOS transistor receives a ground potential, wherein a drain terminal of the fourth NMOS transistor is coupled to the output terminal of the line driver circuit, and wherein the first, second and third voltage converters receive the input signal.

2. The line driver circuit of claim 1, wherein when the input signal is at a logic low level, the output voltage of the first voltage level converter is at a voltage defined by a difference between the supply voltage and a first intermediate voltage that is smaller than a breakdown voltage of the plurality of PMOS and NMOS transistors, and wherein when the input signal is at a logic high level, the output voltage of the first voltage level converter is at the supply voltage.

3. The line driver circuit of claim 2, wherein when the input signal is at a logic low level, the output voltage of the second voltage level converter is at a voltage defined by a difference between the supply voltage and the first intermediate voltage, and wherein when the input signal is at a logic high level, the output voltage of the second voltage level converter is at a voltage defined by a difference between the supply voltage and a second intermediate voltage, wherein the second intermediate voltage is smaller than twice the first intermediate voltage by an offset voltage.

4. The line driver circuit of claim 3, wherein when the input signal is at a logic low level, the output voltage of the third voltage level converter is at the second intermediate voltage, and wherein when the input signal is at a logic high level, the output voltage of the third voltage level converter is at the first intermediate voltage.

5. The line driver circuit of claim 4, wherein the first reference voltage is defined by the difference between the supply voltage and the first intermediate voltage.

6. The line driver circuit of claim 5, wherein the second fixed reference voltage is defined by the first intermediate voltage.

7. The line driver circuit of claim 6, further comprising:
a first diode-connected PMOS transistor coupled between the output terminal and the fourth PMOS transistor.

8. The line driver circuit of claim 7, further comprising:
a second diode-connected NMOS transistor coupled to the output terminal; and
a third diode-connected NMOS transistor coupled between the second diode-connected NMOS transistor and the fourth NMOS transistor.

9. The line driver circuit of claim 8 wherein the supply voltage has a value ranging from 3 volts to 3.63 volts.

* * * * *